United States Patent
Brederlow et al.

(10) Patent No.: US 7,173,302 B2
(45) Date of Patent: Feb. 6, 2007

(54) INTEGRATED CIRCUIT ARRANGEMENT HAVING CAPACITORS AND HAVING PLANAR TRANSISTORS AND FABRICATION METHOD

(75) Inventors: Ralf Brederlow, Poing (DE); Jessica Hartwich, Neubiberg (DE); Christian Pacha, München (DE); Wolfgang Rösner, Ottobrunn (DE); Thomas Schulz, Austin, TX (US)

(73) Assignee: Infineon technologies AG, Munich (DE)

( * ) Notice: Subject to any disclaimer, the term of this patent is extended or adjusted under 35 U.S.C. 154(b) by 0 days.

(21) Appl. No.: 10/531,493

(22) PCT Filed: Oct. 10, 2003

(86) PCT No.: PCT/DE03/03354

§ 371 (c)(1),
(2), (4) Date: Apr. 15, 2005

(87) PCT Pub. No.: WO2004/038802

PCT Pub. Date: May 6, 2004

(65) Prior Publication Data

US 2006/0022302 A1    Feb. 2, 2006

(30) Foreign Application Priority Data

Oct. 18, 2002    (DE) ............................... 102 48 723

(51) Int. Cl.
*H01L 27/108* (2006.01)
*H01L 21/8242* (2006.01)

(52) U.S. Cl. ............................ 257/296; 257/E27.084; 438/250

(58) Field of Classification Search ........ 257/296–310; 438/238, 239, 386, 250
See application file for complete search history.

(56) References Cited

U.S. PATENT DOCUMENTS 4,753,896 A    6/1988    Matloubian
5,555,520 A *  9/1996    Sudo et al.

(Continued)

FOREIGN PATENT DOCUMENTS

JP    57176757 A    10/1982

(Continued)

OTHER PUBLICATIONS

International Search Report from corresponding PCT application No. PCT/DE2003/03354.

(Continued)

*Primary Examiner*—Evan Pert
(74) *Attorney, Agent, or Firm*—Brinks Hofer Gilson & Lione

(57) ABSTRACT

An integrated circuit arrangement and method of fabricating the integrated circuit arrangement is described. The integrated circuit arrangement contains an insulating region and a sequence of regions which forms a capacitor. The sequence contains a near electrode region near the insulating region, a dielectric region, and a remote electrode region remote from the insulating region. The insulating region is part of an insulating layer arranged in a plane. The capacitor and an active component are arranged on the same side of the insulating layer and form a memory cell. The near electrode region and an active region of the component are arranged in a plane which lies parallel to the plane in which the insulating layer is arranged. A processor is also contained in the integrated circuit arrangement.

15 Claims, 6 Drawing Sheets

U.S. PATENT DOCUMENTS

| | | |
|---|---|---|
| 5,998,807 A | 12/1999 | Lustig et al. |
| 6,133,075 A | 10/2000 | Yamazaki et al. |
| 6,140,162 A | 10/2000 | Yeo |
| 6,294,420 B1 * | 9/2001 | Tsu et al. .................. 438/239 |
| 6,414,345 B1 | 7/2002 | Suzawa |
| 6,417,057 B1 | 7/2002 | Takemura et al. |
| 6,459,113 B1 * | 10/2002 | Morihara et al. ........... 257/296 |
| 6,462,364 B1 | 10/2002 | Horiuchi |
| 6,462,723 B1 | 10/2002 | Yamazaki et al. |
| 6,525,556 B2 * | 2/2003 | Matsueda |
| 6,569,717 B1 | 5/2003 | Murade |

FOREIGN PATENT DOCUMENTS

| | | |
|---|---|---|
| JP | 61113271 A | 5/1986 |
| JP | 62259466 | 11/1987 |

OTHER PUBLICATIONS

German Office Action from German application No. 10248723.5.
International Examination Report from corresponding PCT application No. PCT/DE2003/03354.

* cited by examiner

INTEGRATED CIRCUIT ARRANGEMENT HAVING CAPACITORS AND HAVING PLANAR TRANSISTORS AND FABRICATION METHOD

This application is the national stage application of international application number PCT/DE03/003354, filed on Oct. 10, 2003, which claims the benefit of priority to German Patent Application 102 48 723.5, filed on Oct. 18, 2002, incorporated herein by reference.

The invention relates to an integrated circuit arrangement, which contains an electrically insulating insulating region and at least one capacitor. The capacitor is formed from a sequence of regions which contains in the order specified:

an electrode region near the insulating region,
a dielectric region, and
an electrode region remote from the insulating region.

The electrically insulating insulating region comprises, for example, an electrically insulating material having a resistivity of greater than $10^{12}$ Ωcm (ohm centimeters) at 20° C. room temperature, e.g. an oxide, in particular silicon dioxide. The electrode region contains, by way of example, a metal having an electrical resistivity of less than $10^{-4}$ Ωcm at 20° C. room temperature. As an alternative, the electrode regions contain polycrystalline silicon, for example, which is highly doped. The dielectric region likewise comprises an electrically insulating material, e.g. an oxide, in particular silicon dioxide, which has a dielectric constant of about 3.9. However, dielectric materials having a significantly larger dielectric constant are also used in the dielectric region.

It is an object of the invention to specify a simple-to-fabricate integrated circuit arrangement with a capacitor. The intention is to enable the circuit arrangement to be fabricated in particular with a small number of process steps and in particular using a small number of lithographic masks. Moreover, the intention is to specify a simple fabrication method for an integrated circuit arrangement with a capacitor.

The object relating to the circuit arrangement is achieved by means of an integrated circuit arrangement having the features specified in patent claim 1.

Developments are specified in the subclaims. In the circuit arrangement according to the invention, the insulating region is part of an insulating layer arranged in a plane. The capacitor and at least one active component of the integrated circuit arrangement, preferably all the active components of the integrated circuit arrangement, lie on the same side of the insulating layer. Moreover, the electrode region near the insulating region and the active region of the component are arranged in a plane which lies parallel to the plane in which the insulating layer is arranged.

The circuit arrangement according to the invention is constructed in a simple manner and can be fabricated in a simple manner because the electrode region near the insulating region and the active region are situated in one plane. Moreover, the electrode region near the insulating region and the active region are insulated by the insulating region. Freely selectable potentials can thus be applied to both electrode regions of the capacitor.

The capacitor additionally has outstanding electronic properties:

the ratio between parasitic capacitances and resistances in relation to the useful capacitance is small,
the leakage currents are small,
the differential nonlinearity of the capacitance is small, different differential capacitances being attributable to space charge zones. In the case of analog capacitances, the differential capacitance is the capacitance which is effective at the operating point.
the capacitance is constant over a wide operating point range,
the capacitance/area ratio that can be obtained is large, for example more than 10 femtofarads per square micrometer or even greater than 20 femtofarads per square micrometer.

Moreover, no further layer or further layer sequence is necessary between the active components and the capacitor. This makes it possible to reduce the number of required layers and to increase the planarity of the integrated circuit arrangement.

In one development, the active component is a field-effect transistor:

the channel region of the field-effect transistor is the active region.
the control electrode of the field-effect transistor is part of a patterned electrode layer in which the electrode region of the capacitor which is remote from the insulating region is also arranged. The control electrode and the electrode region remote from the insulating region comprise the same material. The thickness of these regions and the dopant concentration thereof also correspond.
in one configuration, a control electrode insulation region of the field-effect transistor comprises the same material as the dielectric region of the capacitor. The thickness of these regions also corresponds.

This measure means that only three layer production processes are required for the fabrication of the capacitor and for fabricating the field-effect transistor. The regions of the field-effect transistor and of the capacitor which lie in the same layer can be patterned jointly. An additional mask for fabricating the capacitor is necessary only when the bottom electrode region of the capacitor is doped differently than the channel region of the field-effect transistor. A further additional mask is necessary only when the materials and/or the insulating thicknesses of the control electrode insulating region and of the dielectric region of the capacitor differ. Even then, however, the number of masks required for fabricating the circuit arrangement is still small.

In a next development, the field-effect transistor is a planar field-effect transistor, i.e. the area which is effective for the control of the gate electrode lies parallel to the insulating layer. In addition to HDD terminal regions (highly doped drain), the field-effect transistor also contains, if appropriate, LDD terminal regions (lightly doped drain) or auxiliary terminal regions and/or so-called pockets or halos, which are designated as auxiliary doping regions here.

In another configuration, the control electrode adjoins a silicide region. This measure makes it easier to make contact with the control electrode. The contact resistance and the sheet resistance are additionally reduced.

In a next development of the circuit arrangement according to the invention, terminal regions of the field-effect transistor adjoin the insulating layer. In one configuration, the terminal regions likewise adjoin silicide regions. Sufficient material for the silicide formation is present when the semiconductor layer, both before and after the silicide formation, has a larger thickness in the region of the terminal regions than in the region of the electrode near the insulating region.

In a next development, spacers are arranged on both sides of the control electrode. The spacers also comprise a different material than the electrode layer, in particular a material which is not suitable as a starting point for an epitaxial layer growth during an epitaxy method for producing a semiconductor epitaxial layer, for example silicon nitride. The use of spacers means that side regions of the control electrode are covered, so that no epitaxy can proceed from there and short circuits are avoided.

In one configuration, a spacer is likewise arranged at at least one side of the electrode region remote from the insulation region. The spacers have fulfilled the same task as the spacers arranged at the control electrode. If a spacer arranged at the gate and a spacer arranged at an electrode of the capacitor touch one another, then a masking arises which, by way of example, prevents a doping or else a siliciding in the masked region.

In one development, that side of the electrode region near the insulating region which adjoins one terminal region of the transistor is longer than a side of the electrode region near the insulating region which lies transversely with respect to said side, preferably being at least twice as long or at least five times as long. In this case, the transistor has a transistor width which is a multiple of the minimum feature size, preferably more than three-fold or more than five-fold. These measures result in a particularly low-impedance connection between the transistor and the capacitor. This leads to the improvement of the electronic properties particularly in so-called analog capacitances in analog circuits. Examples of such analog circuits are analog-to-digital converters. Another example of an analog capacitance is a so-called bypass capacitance which can be used to smooth voltage spikes on an operating voltage line or a signal line.

In an alternative development, by contrast, a side of the electrode region near the insulating region which lies transversely with respect to that side of the electrode region near the insulating region which adjoins the terminal region is longer than the side adjoining the terminal region, preferably at least twice as long or at least five times as long. In this case, the transistor has a transistor width which is less than three times the minimum feature size, preferably less than twice the minimum feature size. What is achieved by this measure particularly in the case of memory cells is that the nonreactive resistance of the bottom electrode of the capacitor is increased and a fast discharge of the storage capacitance is thus counteracted.

In a next development, a terminal region of the field-effect transistor and the electrode region of the capacitor which is near the insulating region adjoin one another and thus form an electrically conductive connection. This results in a simply constructed memory cell of a DRAM (Dynamic Random Access Memory), without necessitating additional measures for making contact with the bottom electrode near the insulating region. This development is used in particular in combination with spacers touching one another at the gate and at the covering electrode of the capacitor.

In one development, the electrode region near the insulating region and the active region are semiconductor regions which contain a semiconductor material, i.e. a material having an electrical resistivity of between $10^{-6}$ and $10^{+12}$ Ωcm, in particular between $10^{-5}$ and $10^{+10}$ Ωcm, e.g. germanium, silicon or gallium arsenide. The resistivity of the electrode region of the capacitor which is near the insulating region is reduced by a doping in one configuration.

In one development of the circuit arrangement, the electrode region near the insulating region and the active region are monocrystalline regions which are doped or undoped. The electronic properties of active components in monocrystalline layers are particularly good. Moreover, the electrical resistance of a monocrystalline electrode of the capacitor can be reduced particularly well by doping. In one configuration, the electrode region near the insulating region and the active region have a thickness of less than 100 nanometers or even less than 50 nanometers.

In a next development, the insulating layer adjoins a carrier substrate, as is the case with a so-called SOI substrate (Silicon On Insulator). Substrates of this type can be fabricated in a simple manner. Moreover, the electronic circuits arranged on these substrates have particularly good electronic properties.

In another development, the circuit arrangement contains at least one processor containing a multiplicity of logical switching functions. If, in one configuration, the circuit arrangement additionally contains a multiplicity of DRAM memory units (Dynamic Random Access Memory) beside the processor, then a term that is also used is an embedded memory. In order to fabricate this circuit arrangement, in addition to the process steps and masks that are necessary anyway for fabricating the logic, only a small number of additional process steps and additional masks are required for fabricating the capacitor or the transistors that are electrically conductively connected thereto.

The invention additionally relates, in a further aspect, to a method for fabricating an integrated circuit arrangement, in particular for fabricating the circuit arrangement according to the invention or one of its developments. In the method according to the invention, the following method steps are performed without any restriction by the order specified:

provision of a substrate containing an insulating layer made of electrically insulating material and a semiconductor layer, e.g. an SOI substrate, patterning of the semiconductor layer in order to form at least one electrode region for a capacitor and in order to form at least one active region of a transistor, after the patterning of the semiconductor layer production of a dielectric layer, after the production of the dielectric layer production of an electrode layer, and formation of an electrode of the capacitor which is remote from the insulating region and of a control electrode of the transistor in the electrode layer.

The method according to the invention is particularly suitable for fabricating a planar field-effect transistor together with the capacitor. The abovementioned technical effects of the circuit arrangement according to the invention and of its developments also apply to the method according to the invention and the developments thereof.

Exemplary embodiments of the invention are explained below with reference to the accompanying drawings, in which:

FIGS. 1 to 12 show fabrication stages in the fabrication of a transistor-capacitor arrangement, FIGS. 1 to 12 relating to a sectional illustration along a sectional plane I, which lies longitudinally with respect to a channel of a field-effect transistor, in particular longitudinally with respect to the current flow in the channel. The position of the sectional plane I becomes clear from FIG. 13.

Figure 1:
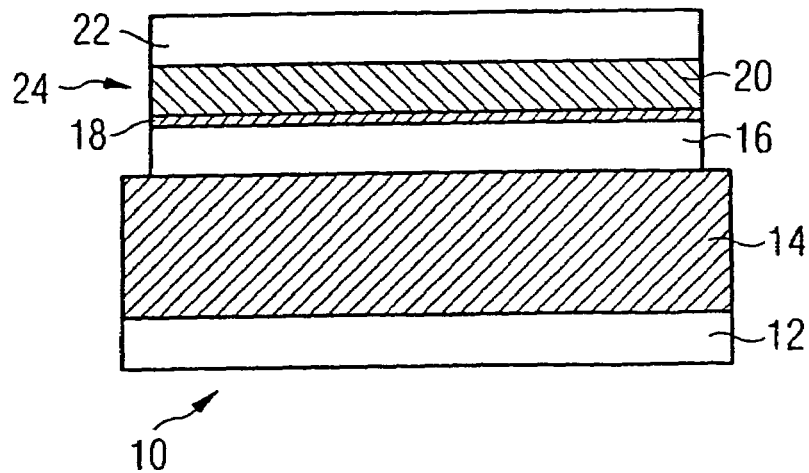
FIGS. 1 to 12 show fabrication stages in the fabrication of an integrated transistor-capacitor arrangement.

The fabrication of the transistor-capacitor arrangement begins proceeding from an SOI substrate 10, which contains a carrier substrate 12 made of monocrystalline silicon, a so-called buried insulating layer 14 made of silicon dioxide, for example, and a thin semiconductor layer 16 made of monocrystalline silicon. In the exemplary embodiment, the thickness of the carrier substrate 12 is 550 micrometers, the thickness of the insulating layer 14 is 100 nanometers and the thickness of the semiconductor layer 16 is 50 nanometers. A thin silicon dioxide layer 18 having a thickness of 5 nanometers, for example, has formed on the semiconductor layer 16.

As illustrated in FIG. 1, a silicon nitride layer 20 is deposited onto the SOI substrate 10, for example with the aid of a CVD method (Chemical Vapor Deposition). In the exemplary embodiment, the silicon nitride layer 20 has a thickness of 50 nanometers.

As illustrated in FIG. 1, a lithography method is subsequently carried out. To that end, a photoresist layer 22 is applied over the whole area, exposed in accordance with a predetermined layout and developed. Afterward, the nitride layer 20 serving as a hard mask, the silicon dioxide layer 18 and the semiconductor layer 16 are patterned, for example by means of a dry etching method. This results in a layer stack 24 having an approximately square base area. The layer stack 24 is also referred to as a mesa. The geometry for the field-effect transistor to be fabricated and the geometry for the capacitor can be prescribed and thus optimized independently of one another.

As an alternative to a photolithographic method, in another exemplary embodiment, an electron beam lithography method or another suitable method is carried out. In another exemplary embodiment, no hard mask is used. By way of example, the photoresist layer 22 is then applied with a larger thickness.

Figure 2:
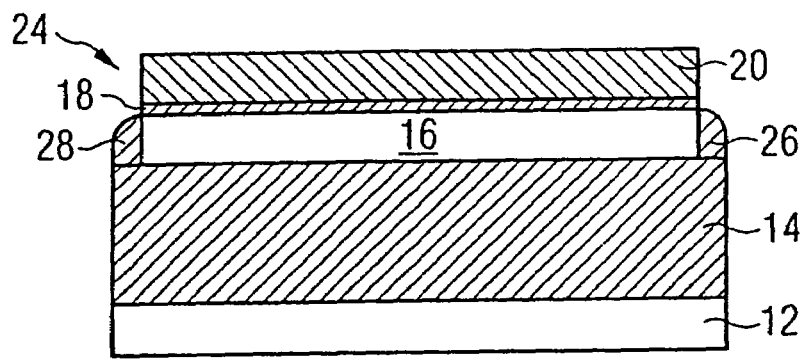

As illustrated in FIG. 2, the residual regions of the photoresist layer 22 are subsequently removed. After the removal of the photoresist layer 22, a thermal oxidation is performed. Rounding oxide regions 26, 28, which later suppress undesirable channel formations at the edges, form at the side areas of the semiconductor layer 16 in the process. As an alternative, for insulating purposes, it is possible to perform a LOCOS method (LOCal Oxidation of Silicon) or an STI method (Shallow Trench Isolation) in conjunction with a CMP method (Chemical Mechanical Polishing).

The residual regions of the nitride layer 20 and of the silicon dioxide layer 18 are then removed, for example by means of dry etching. A thin screen oxide can be applied for subsequent implantation steps, but this is not illustrated in the figures.

Figure 3:
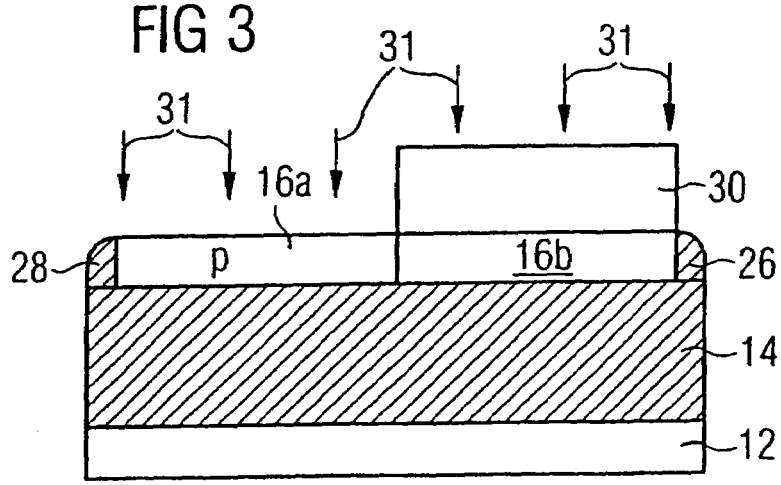

As illustrated in FIG. 3, afterward, in order to fabricate an nMOSFET, a further photoresist layer 30 is applied, exposed and developed, so that only the channel region and regions for terminal regions of the transistor are unmasked, see transistor part 16a of the semiconductor layer 16. By contrast, a region provided for the capacitor is masked, see capacitor part 16b of the semiconductor layer 16. After the photoresist layer 30 has been developed, an ion implantation 31 is performed, the transistor part being p-doped, e.g. p or p+.

Figure 4:
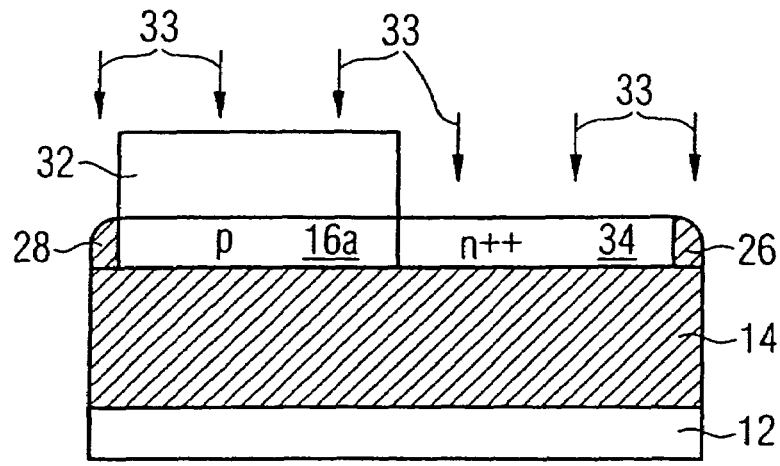

As illustrated in FIG. 4, a further photolithography method is subsequently performed, in which an additional mask is necessary for fabricating the capacitor. A photoresist layer 32 is applied, exposed using the mask and developed, so that the transistor part 16a is masked and the capacitor part 16b is unmasked.

Afterward, an ion implantation 33 is carried out using the patterned photoresist layer 32, the capacitor part 16b being heavily n-doped, i.e. n++, and a bottom electrode region 34 being produced. In the masked transistor part 16a, the doping remains unchanged during the ion implantation 33. The bottom electrode region 34 acquires low impedance as a result of the additional implantation. By way of example, the doping density amounts to $10^{20}$ doping atoms per cubic centimeter. The doping density preferably lies in the range of between $10^{19}$ and $10^{21}$ doping atoms per cubic centimeter. As the doping density increases, the dielectric grows more rapidly than on undoped or only medium-heavily doped regions. However, as the doping density increases, the space charge zones that form become smaller, so that parasitic effects likewise become smaller.

Figure 5:
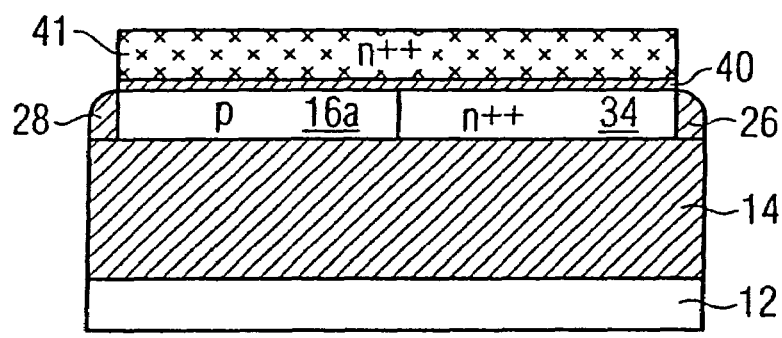

As illustrated in FIG. 5, the photoresist layer 32 is subsequently removed. A thin silicon dioxide layer 40 is subsequently produced at the uncovered area of the transistor part 16a of the semiconductor layer 16 and at the uncovered area of the bottom electrode region 34, which silicon dioxide layer forms a gate oxide 42 in the region of the transistor and a dielectric 46 in the region of the capacitor. By way of example, the silicon dioxide layer 40 grows thermally. In the exemplary embodiment, the silicon dioxide layer 40 has a thickness of 2 nanometers in the region of the undoped silicon.

In an alternative exemplary embodiment, using a further lithography method, a dielectric made of a different material and/or a dielectric having a different thickness than on the transistor part 16b of the semiconductor layer 16 is produced on the bottom electrode region 34 of the capacitor.

As is further illustrated in FIG. 5, in-situ or subsequently doped polycrystalline silicon is then deposited, a polysilicon layer 41 being produced. The polysilicon layer 41 has, by way of example, a thickness of 100 nanometers and a dopant concentration of $10^{21}$ doping atoms per cubic centimeter. The heavy doping of the n conduction type is once again represented by the symbol $n^{++}$. Phosphorus atoms, for example, are used as doping atoms. In another exemplary embodiment, an alternative readily conducting material with a suitable material work function is used instead of the polysilicon layer 41.

Figure 6:
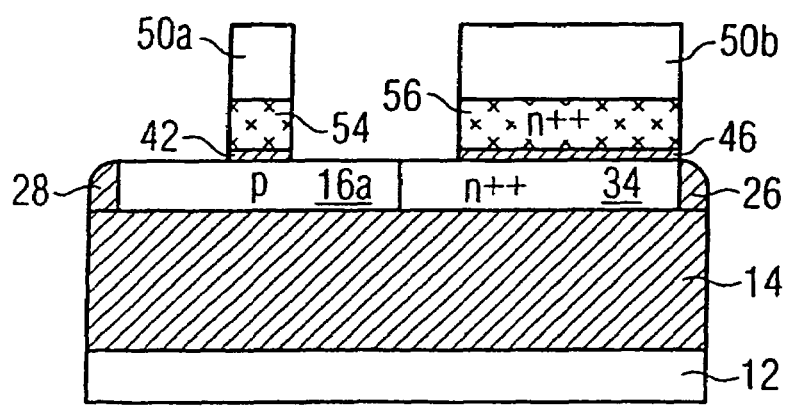

As shown in FIG. 6, a further lithography method is subsequently carried out, inter alia, for patterning a gate electrode 54. To that end, a photoresist layer is applied, exposed and developed, photoresist layer regions 50a and 50b being produced. Afterward, the polysilicon layer 41 and the silicon dioxide layer 40 are patterned, for example etched. This results in a gate electrode 54 below the photoresist layer region 50a and a covering electrode 56 below the photoresist layer region 50b. The etching stops on the transistor part 16a of the semiconductor layer 16 and on the bottom electrode region 34, respectively.

Figure 7:
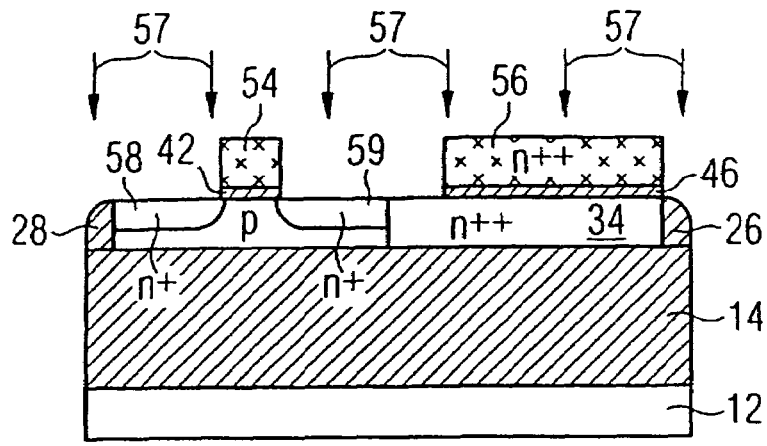

As illustrated in FIG. 7, the photoresist layer regions 50a and 50b are removed after the etching. An ion implantation 57 is then carried out in order to produce weakly doped LDD regions 58 and 59 (Lightly Doped Drain) in upper regions of the transistor part 16a of the semiconductor layer 16.

Figure 8:
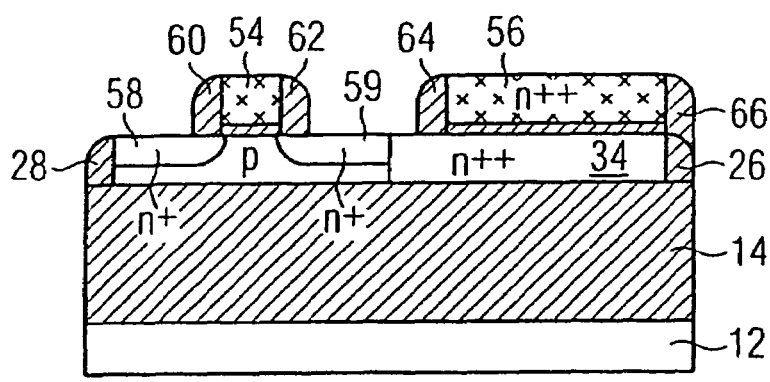

As shown in FIG. 8, a thin TEOS layer or silicon nitride layer is subsequently deposited over the whole area, for example with the aid of a CVD method (Chemical Vapor Deposition). The silicon nitride layer 60 has a thickness of 50 nanometers in the exemplary embodiment. As is further illustrated in FIG. 8, the TEOS layer is subsequently etched back in an anisotropic etching process to form spacers 60 and 62 at the sidewalls of the gate electrode 54 and also to form spacers 64 and 66 at the sidewalls of the covering electrode 56. In this way, both the gate electrode 54 and the covering electrode 56 are insulated toward all sides. A subsequent epitaxy is not possible at the side areas of the gate electrode 54 and of the covering electrode 56, with the result that short circuits are avoided.

Figure 9:
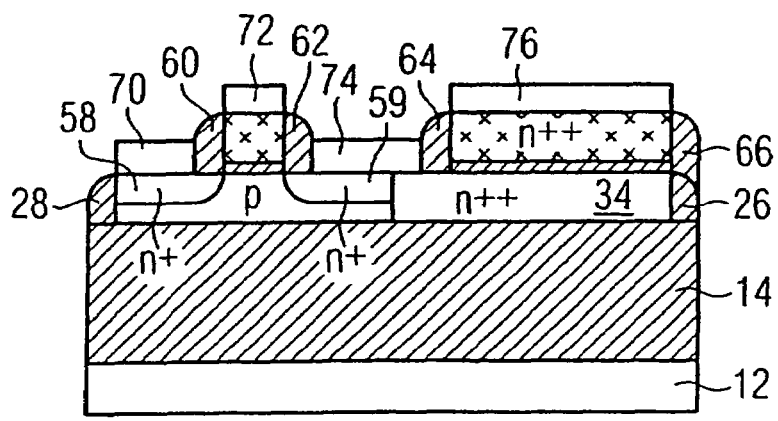

As illustrated in FIG. 9, a selective epitaxy method is subsequently carried out. A monocrystalline epitaxial layer grows on uncovered area sections of the LDD regions 58 and 59 and of the bottom electrode region 54. Epitaxial regions 70 and 74 are produced on the monocrystalline silicon of the semiconductor layer 16. The epitaxial regions 70 and 74 extend approximately up to half the height of the gate electrode 54 and of the covering electrode 56, respectively. The epitaxial regions 70 and 74 are also referred to as "elevated" source/drain regions. The thickness of the epitaxial layer for the epitaxial regions 70 and 74 primarily depends on the thickness of the semiconductor layer 16 and the siliciding explained below. The siliciding consumes silicon that is present, with the result that a correspondingly large amount of silicon is provided for the reaction. This measure prevents a "tearing away" of the channel terminals in the region of the drain-source region. Epitaxial regions 72 and 76 are situated on the gate electrode 54 and on the covering electrode 56, respectively. The epitaxial regions 72 and 76 are not present if alternative gate materials are used.

Figure 10:
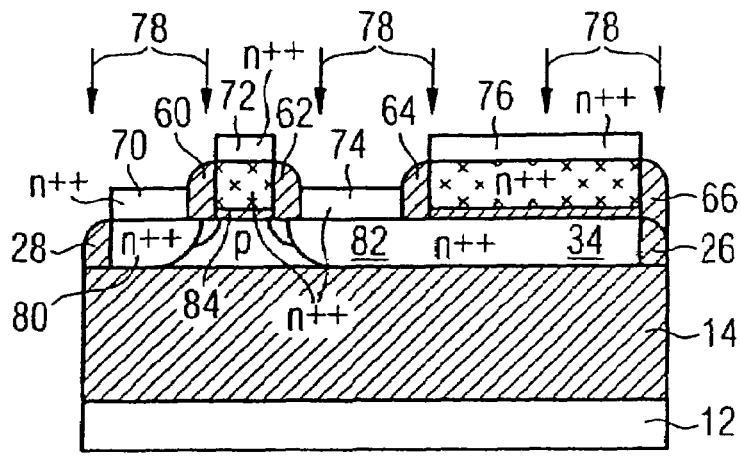

As shown in FIG. 10, after the epitaxy method, an ion implantation 78, e.g. n++, i.e. heavily n-doped, is carried out in order to fabricate highly doped and thus low-impedance source/drain regions 80 and 82. The epitaxial regions 70 to 76 are also doped in the process. A mask is necessary here merely for separating regions with complementary transistors in a CMOS process (Complementary Metal Oxide Semiconductor). A connection is produced between the source/drain region 82 and the bottom electrode region 34 of the capacitor.

A channel region 84 lying between the source/drain regions 80 and 82 in the transistor part 16a of the semiconductor layer 16 remains p-doped. The spacers 60 and 62 and also the gate stack serve as an implantation mask during the implantation.

Figure 11:
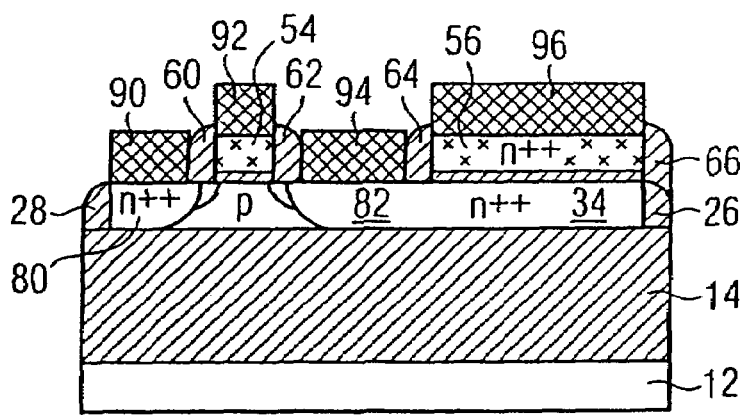

As illustrated in FIG. 11, a salicide method (self-aligned silicide) is carried out after the HDD implantation (High Density Drain). To that end, by way of example, a nickel layer is deposited over the whole area. At temperatures of 500° C., for example, nickel silicide forms in the epitaxial regions 70 to 76 and thus on the source/drain regions 80, 82, on the gate electrode 54 and on the covering electrode 56, see silicide regions 90 to 96. Instead of nickel, it is also possible to use a different metal with a melting point of more than 1400 degrees Celsius, in particular a refractory metal, in order e.g. to fabricate titanium silicide or cobalt silicide. The epitaxial regions 70 to 76 are completely silicided in the exemplary embodiment shown in FIG. 11. By contrast, the semiconductor layer 16 and the covering electrode 56 have not been silicided. In another exemplary embodiment, regions of the semiconductor layer 16 and of the covering electrode 56 are also silicided.

Figure 12:
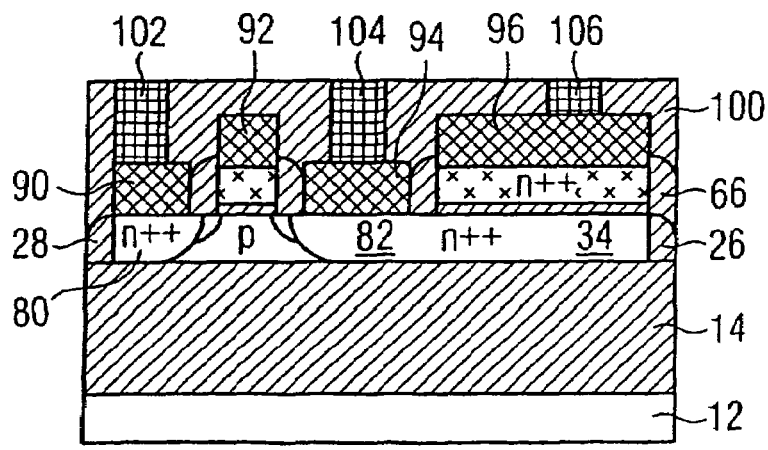

As illustrated in FIG. 12, a passivation layer 100 is subsequently applied, for example a TEOS layer (tetraethyl orthosilicate), a BPSG layer (borophosphorus silicate glass) or a layer made of another suitable material. Contact holes are etched into the passivation layer 100 using a photolithographic method and filled with tungsten, for example, thus producing connecting sections 102, 104 and 106 which lead in this order to the silicide region 90, 94 and 96, respectively. The connecting sections 102 to 106 are subsequently also connected to interconnects of a metalization layer or a plurality of metalization layers (not illustrated). A conventional CMOS process, also referred to as "back end", is performed in this case.

Further intermediate layers are generally introduced in the contact holes for the purpose of better adhesion or as a diffusion barrier. These intermediate layers are not illustrated in FIG. 12 for reasons of better clarity. By way of example, said layers comprise titanium nitride.

The metal interconnects are fabricated for example by means of a so-called dual damascene method, in which copper is filled into trenches. Polishing is then effected by means of a chemical mechanical polishing method (CMP). However, other methods are also used, e.g. the etching of aluminum layers.

Figure 13:
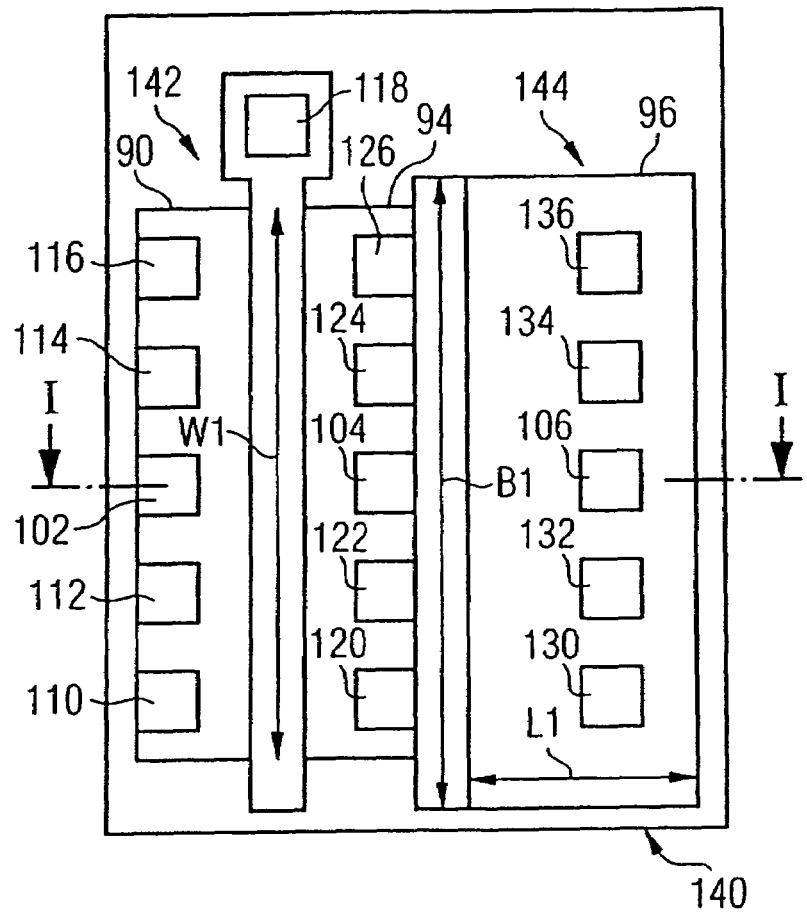
FIG. 13 shows a plan view of the transistor-capacitor arrangement.

FIG. 13 shows a plan view of the transistor-capacitor arrangement 140, which contains a planar SOI-FET 142 and a capacitor 144.

The transistor 142 has a transistor width W1 corresponding approximately to 10 times the minimum feature size F. On account of this transistor width, besides the connecting section 102 there are four further connecting sections 110 to 116 which lead to the silicide region 90. Besides the connecting section 104 there are likewise four additional connecting sections 120 to 126 which lead to the silicide region 94. Besides the connecting section 106 four further connecting sections 130 to 136 lead to the silicide region 96 and thus also to the covering electrode 56.

The length L1 of the capacitor 144 is considerably shorter than the width B1 thereof. In the exemplary embodiment, the width B1 approximately corresponds to the transistor width. The length L1 approximately amounts to only one third of the width B1. On account of these dimensions and on account of the multiplicity of connecting sections 102 to 136 the capacitor 144 can be subjected very rapidly to charge reversal.

Figure 14:
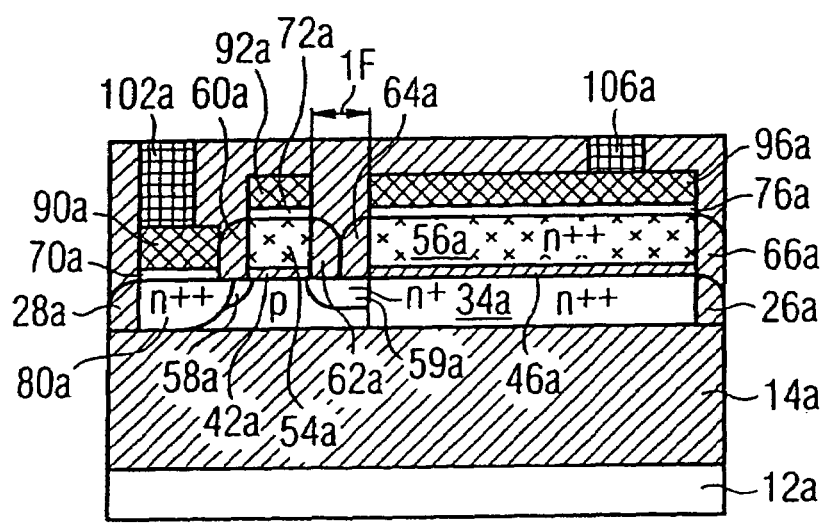
FIG. 14 shows a sectional illustration through a DRAM memory cell with a transistor.
Figure 15:
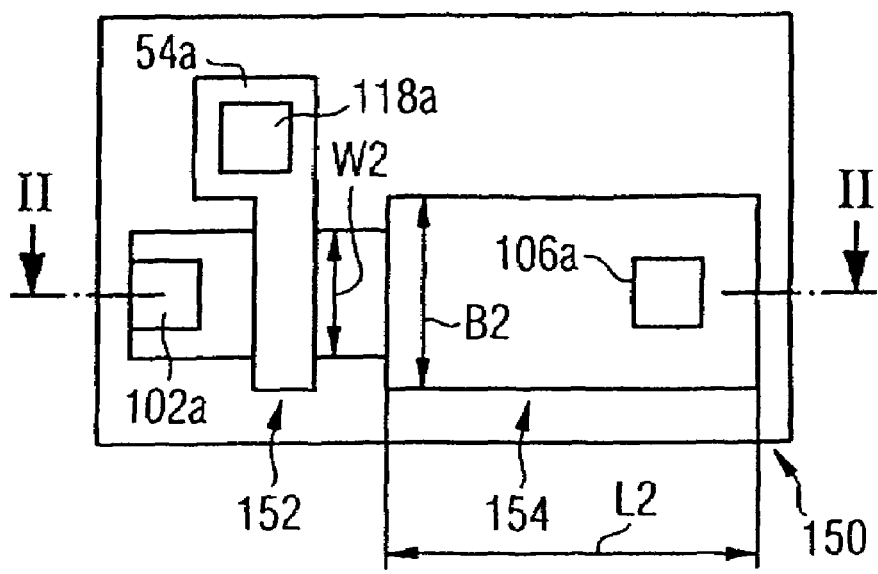
FIG. 15 shows a plan view of the DRAM memory cell.

A preferred area of application for a transistor-capacitor arrangement is a dynamic memory cell, in particular a so-called embedded DRAM memory cell 150, as is illustrated in FIGS. 14 and 15. The memory cell 150 contains only one access transistor 152 and a capacitor 154. The method steps explained above with reference to FIGS. 1 to 12 have also been performed in the fabrication of the memory cell 150. Therefore, in FIGS. 14 and 15, identical elements are identified by identical reference symbols, but followed by a lower-case letter a.

Consequently, the planar field-effect transistor 152 contains, inter alia:
a control electrode 54a,
a gate oxide 42a,
LDD regions 58a, 59a,
terminal regions 80a, 82, and
spacers 60a, 62a.
The capacitor 154 contains:
a bottom electrode region 34a,
a dielectric 46a,
a covering electrode 66a, and
spacers 64a.

Epitaxial regions 70a, 72a and 76a above the terminal region 80a, above the control electrode 54a and above the covering electrode 56a, respectively, have not been completely silicided, so that silicide regions 90a to 96a are arranged on said epitaxial regions 70a, 72a and 76a.

FIG. 14 shows the memory cell 150 in a sectional plane II, which is depicted in FIG. 15 and lies in the longitudinal direction of the current flow in the channel of the transistor 152. The distance between the covering electrode 56a and the gate electrode 54a has been reduced to the minimum feature size 1 F. The spacer 62a arranged at the gate electrode 54a and the spacer 64a arranged at the covering electrode 56a touch one another, with the result that the drain is not silicided. Moreover, this also means that on the drain side there is only an LDD region 59a present, but no additional terminal region. No connecting section leads to the drain either. The LDD region 59a leads directly to the bottom electrode region 34a. The thus increased contact resistance of the bottom electrode region 34a counteracts a discharging of the capacitor 154. The discharging of the capacitor 154 is also counteracted by the fact that the width B2 of the capacitor is considerably shorter than the length L2 thereof. The low leakage current of the planar SOI transistor 152 also prevents a rapid discharging of the storage capacitance.

In order to obtain the highest possible packing density with a minimum leakage current, the transistor 152 has a small transistor width W2 of 1.5 F to 3 F, for example. The capacitor 154 has the form of a horizontal strip whose length L2 is determined by the required minimum storage capacitance of the memory cell 150. The transistor width W2 and the width B2 of the capacitor approximately correspond. By way of example, the deviation is less than 50 percent. The capacitor 154 is shown shortened in relation to the transistor 152 in FIGS. 13 and 14.

When medium-sized SRAM memory units (Static Random Access Memory) are replaced by a fast embedded DRAM, for example in the second and third access levels of a microprocessor memory hierarchy, i.e. in the second and third level cache, the following calculations result. By way of example, hitherto an SRAM memory cell has had an area of 134 $F^2$, where F is the minimum feature size. If a dielectric having a dielectric constant $\epsilon r$ of 3.9 is used, by way of example, then it is possible to realize a typical embedded DRAM capacitance CMEM of 10 femtofarads per memory cell in accordance with the following calculations. The oxide capacitance amounts to:

$COX = \epsilon r \ \epsilon 0/tphys = 34.5$ fF/$\mu m^2$, where tphys is the oxide thickness, amounting to one nanometer in the exemplary embodiment. This results in a required area AMEM of the storage capacitance of:

$AMEM = CMEM/COX = 0.29 \ \mu m^2$.

For a minimum feature size F equal to sixty-five nanometers, this corresponds to 69 $F^2$ for the capacitance or 90 $F^2$ for the entire memory cell including access transistor. The area of the embedded DRAM memory cell is thus far less than the SRAM cell size of 134 $F^2$.

Given an effective oxide thickness of one nanometer, a correction of 0.8 nanometer for the gate and top silicon depletion and on account of the quantum mechanical effects, there results a capacitance per area of:

$COX = 3.9 \ \epsilon 0/tox = 19$ fF/$\mu m^2$, where tox equal to 1.8 nanometers denotes the electrically effective oxide thickness and $\epsilon 0$ denotes the permittivity of free space. Given the use of a metal gate, the electrically effective oxide thickness decreases by about 0.4 nanometer on account of the gate depletion that is no longer present, as a result of which the capacitance per area increases to:

$COX = 3.9 \ \epsilon 0/tox = 24$ fF/$\mu m^2$.

The capacitances according to the invention are also used as so-called bypass capacitances for attenuating so-called spikes and for attenuating crosstalk in the voltage supply of the integrated circuit arrangement. They are also highly suitable as analog capacitances, in particular in oscillators or analog-to-digital converters. The capacitances are also used for so-called mixed-signal circuits, i.e. for circuits having analog capacitances and e.g. storage capacitances in memory cells.

In other exemplary embodiments, a separate high-K DRAM dielectric where $\epsilon r$ is greater than 100 and having effective oxide thicknesses smaller than teff equal to 0.1 nanometer is used instead of the gate oxide. For example a dielectric containing barium strontium titanate (BST) or epitaxial barium strontium titanate. The area requirement for a DRAM memory cell thus decreases to approximately 22 $F^2$. A second additional mask is used to define the region for the high-K dielectric on the SOI stacks.

In the case of the invention, a capacitance is integrated into the FET plane, that is to say into the so-called top silicon on an SOI substrate. The fabrication of the SOI capacitance requires only one additional process step if the particularly high-quality gate dielectric of the transistor is utilized as the dielectric of the capacitor.

Further advantages that are afforded over previous technological concepts are a planar transition between pure logic blocks and embedded DRAM blocks. Furthermore, deep vias and contacts are avoided.

Both an LDD doping (Lightly Doped Drain) and an HDD doping (Highly Doped Drain) were carried out in the exemplary embodiments explained with reference to FIGS. 1 to 15. In another exemplary embodiment, by contrast, only an HDD doping but no LDD doping is carried out.

In a further exemplary embodiment, a transistor and the capacitor are arranged spatially further away from one another and respectively provided with dedicated connecting sections.

Figure 16:
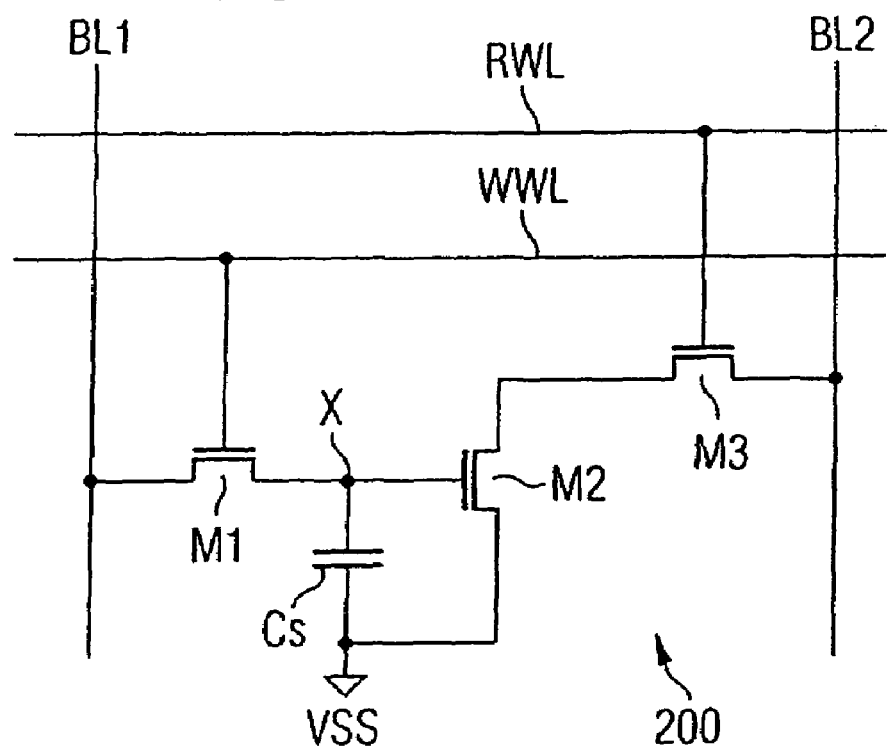
FIG. 16 shows a circuit diagram of a DRAM memory cell with three transistors.

FIG. 16 shows a circuit diagram of a DRAM memory cell 200 (Dynamic Random Access Memory) having three transistors M1 to M2 and also having a capacitor Cs, which have been fabricated by means of the method steps explained with reference to FIGS. 1 to 12. By way of example, the transistor 152 illustrated in FIG. 14 is the transistor M1 in a first case. The capacitor 154 is then the capacitor Cs. In the first case, an electrically conductive connection leads from an additional pad adjoining the bottom electrode region 34a in the semiconductor layer 16 to the gate of the transistor M2.

As an alternative, the layout in a second case is chosen such that the transistor 152 corresponds to the transistor M2, the capacitor 154 corresponding to the capacitor Cs. In the second case, the covering electrode 56a is electrically conductively connected to one terminal region of the transistor M1 and to the gate of the transistor M2.

The circuit of the memory cell 200 contains a subcircuit for writing and a subcircuit for reading, the charge of the capacitor Cs not being altered during the reading process, with the result that it is also not necessary to refresh this charge after a reading operation.

The subcircuit for writing contains the writing transistor M1 and the capacitor Cs. The gate terminal of the transistor M1 is connected to a write word line WWL. The source terminal of the transistor M1 is connected to a write bit line BL1. In the case of a circuit arrangement having particularly good electrical properties in accordance with the first case mentioned above, the drain terminal of the transistor M1 leads to a storage node X, which is formed by the bottom electrode 34a of the capacitor 154. The covering electrode 56a of the capacitor Cs or 154 is at a ground potential VSS. In the alternative in accordance with the second case, the drain terminal of the transistor M1 leads to a storage node X formed by the covering electrode 56a of the capacitor 154. The bottom electrode 34a of the capacitor Cs is at a ground potential VSS.

The subcircuit for reading contains the transistors M2 and M3. The gate terminal of the transistor M3 is connected to a read word line RWL. The drain terminal of the transistor M3 is connected to a read bit line BL2, which is charged to an operating potential VDD, for example, before the beginning of the reading operation. The source terminal of the transistor M3 is connected to one drain terminal of the transistor M2. The gate terminal of the transistor M2 is connected to the storage node X. The source terminal of the transistor M2 is at the ground potential VSS.

The transistor M2 performs the task of an amplifier, so that reliable reading is still possible even in the event of charge losses on the storage node X. If there is a positive charge on the storage node X, then the transistor M2 is in the switched-on state and the precharged read bit line BL2 is discharged during the reading operation.

Since the gate-source capacitance of the transistor M2 is connected in parallel with the capacitor Cs, the effective storage capacitance Ceff increases:

$$C\!e\!f\!f = Cs + CGS(M2),$$

where Cs is the capacitance of the capacitor Cs and CGS is the gate-source capacitance of the transistor M2. On account of the fabrication method, the capacitances per area of the storage capacitor Cs and of the transistor M2 are e.g. of the same magnitude if the gate oxide and the capacitor dielectric are produced in the same dielectric layer and the layer has the same layer thickness at all points.

The area requirement of the memory cell 200 is determined by the requirements made of the effective storage capacitance Ceff. Given low leakage currents and a high transistor gain, which results in a high read current, it is possible to reduce the size of the storage capacitor Cs. The area required for the capacitor Cs and the electrical properties thereof are principal criteria for the economic fabrication of a memory unit having a multiplicity of memory cells 200. A memory unit having a multiplicity of memory cells 200 is also suitable for replacing an SRAM in a processor memory hierarchy.

The invention claimed is:

1. An integrated circuit arrangement, comprising:
    an electrically insulating insulating region, and
    at least one sequence of regions which forms a capacitor and which contains, in the order specified:
        an electrode region near the insulating region,
        a dielectric region, and
        an electrode region remote from the insulating region,
        the insulating region being part of an insulating layer arranged in a plane,
    the capacitor and at least one active component of the integrated circuit arrangement being arranged on the same side of the insulating layer,
    the electrode region near the insulating region and an active region of the component being arranged in a plane which lies parallel to the plane in which the insulating layer is arranged, and
    the capacitor and the active component forming a memory cell,
    wherein at least one processor is contained in the integrated circuit arrangement.

2. The circuit arrangement as claimed in claim 1, further comprising at least one field-effect transistor, wherein at least one of:
    a channel region of the transistor is the active region,
    a control electrode of the transistor at least one of contains the same material or material of the same dopant concentration as the electrode region remote from the insulating region,
    a control electrode insulation region containing a different material than the dielectric region.

3. The circuit arrangement as claimed in claim 2, wherein at least one of:
    the field-effect transistor is a planar field-effect transistor,
    the transistor contains auxiliary terminal regions, which have a doping with the same conduction type as terminal regions of the transistor but with a dopant concentration that is smaller by at least one order of magnitude, the transistor contains auxiliary doping regions, which are arranged at least one of near the terminal regions or near the auxiliary terminal regions and which have a doping with a different conduction type at least one of than the terminal regions or than the auxiliary terminal regions, or
    the control electrode adjoins a region containing a metal-semiconductor compound.

4. The circuit arrangement as claimed in claim 3, wherein at least one of:
    one terminal region of the transistor or both terminal regions of the transistor adjoin the insulating layer,
    at least one terminal region adjoins a region containing a metal-semiconductor compound,
    a boundary area of at least one terminal region which is remote from the insulating region is further away from the insulating layer than the active region, or
    a boundary area of at least one terminal region which is remote from the insulating region is arranged nearer to the insulating layer than a boundary area of the active region which is remote from the insulating region.

5. The circuit arrangement as claimed in claim 2, wherein at least one of:
    spacers are arranged on both sides of the control electrode, and the spacers comprise a different material than the control electrode,
    a spacer is arranged at at least one side of the electrode region remote from the insulating region, and the spacer comprises a different material than the electrode region remote from the insulating region or
    a spacer arranged at the control electrode and a spacer arranged at the electrode region remote from the insulating region touch one another.

6. The circuit arrangement as claimed in claim 2, wherein at least one of:
    a terminal region of the field-effect transistor and the electrode region of the capacitor which is near the insulating region adjoin one another and have an electrically conductive connection at the boundary,
    the terminal region of the transistor which adjoins the electrode region near the insulating region does not adjoin a region containing a metal-semiconductor compound, or
    wherein another terminal region of the transistor adjoins a region containing a metal-semiconductor compound.

7. The circuit arrangement as claimed in claim 6, wherein:
    a side of the electrode region near the insulating region which adjoins the terminal region is longer than a side of the electrode region near the insulating region which lies transversely with respect to said side near the insulating region, or wherein the side of the electrode region near the insulating region which lies transversely with respect to the side of the electrode region near the insulating region which adjoins the terminal region is longer than the side adjoining the terminal region.

8. The circuit arrangement as claimed in claim 1, wherein at least one of:

the electrode region near the insulating region is a monocrystalline region, at least one of the electrode region near the insulating region or the active region has a thickness of less than 100 nanometers, the active region is a monocrystalline region, the insulating layer adjoins, at one side, a carrier substrate, the insulating layer adjoins the electrode region near the insulating region at a side other than the side at which the insulating layer adjoins the carrier substrate, the boundary areas lie completely in two mutually parallel planes, the insulating layer comprises an electrically insulating material, or the active component is a transistor.

9. The circuit arrangement as claimed in claim 1, wherein at least one of:

the dielectric region comprises silicon dioxide, the dielectric region comprises a material having a dielectric constant of greater than 4, the electrode region remote from the insulating region comprises silicon, the electrode region remote from the insulating region comprises a metal, the electrode region remote from the insulating region contains a low-impedance material, or the electrode region remote from the insulating region adjoins a region containing metal-semiconductor compounds.

10. The circuit arrangement as claimed in claim 1, wherein at least one of:

the processor, is a microprocessor, the capacitor and the active component form a memory cell, or a memory cell contains either a capacitor and only one transistor or a capacitor and more than one transistor.

11. A method for fabricating an integrated circuit arrangement with a capacitor, a transistor, and a processor, in which the following method steps are performed without any restriction by the order specified:

providing a substrate containing an insulating layer made of electrically insulating material and a semiconductor layer, the insulating layer being planar and having an electrically insulating insulating region, patterning the semiconductor layer in order to form at least one electrode region near the insulating region for the capacitor and in order to form at least one active region for the transistor, after the patterning of the semiconductor layer, producing at least one dielectric layer, after the production of the dielectric layer, producing an electrode layer), and forming an electrode of the capacitor which is remote from the insulating region in the electrode layer, wherein the capacitor and the transistor are arranged on the same side of the insulating layer, the electrode region near the insulating region and the active region of the transistor are arranged in a plane which lies parallel to the plane in which the insulating layer is arranged, and the capacitor and the transistor form a memory cell in conjunction with a processor.

12. The method as claimed in claim 11, further comprising at least one of the following steps:

applying at least one auxiliary layer to the semiconductor layer prior to patterning, doping a channel region of the transistor, carrying out of a thermal oxidation in order to form a rounding oxide, doping the electrode near the insulating region, producing the dielectric layer at the same time as a dielectric layer at the active region of the transistor, or forming a control electrode of the transistor at the same time as the formation of the electrode region remote from the insulating region.

13. The method as claimed in claim 11, further comprising at least one of the following steps:

forming auxiliary terminal regions with a lower dopant concentration than terminal regions of the transistor, forming auxiliary doping regions, applying a further auxiliary layer after the patterning of a control electrode of the transistor, or anisotropically etching the further auxiliary layer.

14. The method as claimed in claim 11, further comprising at least one of the following steps:

carrying out of a selective epitaxy on uncovered regions made of semiconductor material at least one of after the formation of the electrode region remote from the insulating region or after the patterning of a control electrode of the transistor, or doping terminal regions of the transistor at least one of after the formation of the electrode region remote from the insulating region or after the patterning of the control electrode.

15. The method as claimed in claim 11, further comprising the following step: selectively forming a metal-semiconductor compound at least one of on the electrode layer or on uncovered semiconductor regions.

* * * * *